United States Patent
Sheats et al.

(10) Patent No.: US 7,141,348 B2
(45) Date of Patent: Nov. 28, 2006

(54) LAMINATION AND DELAMINATION TECHNIQUE FOR THIN FILM PROCESSING

(75) Inventors: James Sheats, Palo Alto, CA (US); Tue Nguyen, Fremont, CA (US)

(73) Assignee: Intelleflex Corporation, San Jose, CA (US)

( * ) Notice: Subject to any disclaimer, the term of this patent is extended or adjusted under 35 U.S.C. 154(b) by 0 days.

(21) Appl. No.: 10/444,435

(22) Filed: May 23, 2003

(65) Prior Publication Data

US 2004/0232943 A1    Nov. 25, 2004

(51) Int. Cl.
    *G03F 7/34* (2006.01)
(52) U.S. Cl. ................ 430/200; 430/15; 430/254
(58) Field of Classification Search ........... 430/15, 430/200, 254
    See application file for complete search history.

(56) References Cited

U.S. PATENT DOCUMENTS

| 5,258,236 | A | * | 11/1993 | Arjavalingam et al. ..... 428/626 |
| 5,534,466 | A | * | 7/1996 | Perfecto et al. ............... 216/20 |
| 5,742,075 | A | | 4/1998 | Burns et al. |
| 5,796,121 | A | | 8/1998 | Gates |
| 5,817,550 | A | | 10/1998 | Carey et al. |
| 6,036,809 | A | | 3/2000 | Kelly et al. |
| 6,114,088 | A | | 9/2000 | Wolk et al. |
| 6,143,117 | A | | 11/2000 | Kelly et al. |
| 6,221,553 | B1 | | 4/2001 | Wolk et al. |
| 6,521,511 | B1 | | 2/2003 | Inoue et al. |
| 6,777,309 | B1 | * | 8/2004 | Liao et al. .................. 438/458 |
| 2001/0036561 | A1 | | 11/2001 | Wolk et al. |
| 2003/0008224 | A1 | * | 1/2003 | Fujita et al. .................. 430/17 |

OTHER PUBLICATIONS

Takumi Ueno, Chapter 8: Chemistry of Photoresist materials, Part II. Resists and Processing, Microlithography: Science and Technology, James R. Sheats, Bruce W. Smith, editors, 1998, pp. 451-476, Marcel Dekker, Inc.

* cited by examiner

*Primary Examiner*—Richard L. Schilling
(74) *Attorney, Agent, or Firm*—Tue Nguyen (57) ABSTRACT

This invention discloses a releasable adhesion layer having good adhesion during high temperature fabrication process in the absence of light, and delaminating at a lower temperature in the presence of light. One embodiment of this invention is a film of polymer whose thermal decomposition temperature changes drastically upon photoexposure. These materials, prior to photoexposure, can withstand temperatures in the range of approximately 200° C. to 300° C. without decomposition, yet decompose at around 100° C. with photoexposure. The releasable adhesion layer can be used in a thermal transfer element, sandwiching a donor substrate and a transfer layer having a plurality of multicomponent transfer units. In the absence of light, the releasable adhesion layer can sustain high temperature processing of these multicomponent transfer units. By photoexposing according to a pattern, the photoexposed multicomponent transfer units can be selectively released at a low temperature to transfer to a receptor.

21 Claims, 8 Drawing Sheets

LAMINATION AND DELAMINATION TECHNIQUE FOR THIN FILM PROCESSING

FIELD OF THE INVENTION

This invention relates to thin film device transfer elements and methods of transferring thin film devices to a receptor. In particular, the invention relates to the problem of producing devices on substrates whose thermal, mechanical or optical properties may be incompatible with the processing conditions necessary to fabricate such devices.

BACKGROUND OF THE INVENTION

In the manufacturing of thin film device products, thin film devices such as field effect transistors (FET), thin film transistors (TFT), light emitting diodes (LED), memory circuits, display circuits or optical devices are fabricated on a substrate through various processes such as chemical vapor deposition, etching, oxidation, and annealing. Since the fabrication processes often involve high temperature treatment, one of the substrate requirements is high temperature heat resistance, meaning the substrate must have a high softening temperature and a high melting temperature. To minimize film stress and maintain good alignment of different patterned layers, it should also have a low coefficient of thermal expansion and low distortion after thermal cycling.

Thin film transistor (TFT) processes for liquid crystal displays currently use quartz glass substrates to provide heat resistance up to approx. 1000° C., or heat-resistant glass substrate to provide heat resistance up to approx. 500° C. However, quartz and heat resistant glass substrates are expensive, heavy and fragile.

Low temperature thin film transistor processes on plastic substrate have been demonstrated, for example, U.S. Pat. No. 5,742,075, "Amorphous Silicon on Insulator VLSI Circuit Structures" by Stanley G. Burns et al;

U.S. Pat. No. 5,796,121, "Thin Film Transistors Fabricated on Plastic Transistors", by Stephen McConnell Gates, and U.S. Pat. No. 5,817,550, "Method for Formation of Thin Film Transistors on Plastic Substrates", by Paul G. Carey et al., but in general, temperatures up to around 200–300° C. may be required to get good device performance as indicated by charge carrier mobility or low interface state density. Polymer substrates which can tolerate these temperatures do exist; for example, polyimides, poly(ether sulphone)s, polycarbonates, polyaramids. But these polymer substrates are often colored, very expensive, have high water absorbance and less than ideal thermal and mechanical properties.

In contrast, the ideal product substrate is preferably as inexpensive as possible, light weight, transparent, resistant to deformation to a certain extent, and invulnerable to dropping. Thus there is a difference between the requirements of a substrate for fabrication processes and the characteristics desirable for a product substrate. It has been extremely difficult to satisfy both these required process conditions and desirable product characteristics.

The substrate transfer method can be used to address the above problems. The thin film devices are fabricated on a donor substrate having the desired optimal properties for fabrication processes in which the donor substrate has been first coated with a suitable releasable adhesion layer. Then the fabricated thin film devices are transferred to a target substrate (or a receptor) having the desired product characteristics. For example, see Wolk et al., U.S. Pat. No. 6,114,088, and its divisions, U.S. Pat. No. 6,221,553 and U.S. patent publication 2001/0036561, "Thermal transfer element for forming multilayer devices", and Inoue et al., U.S. Pat. No. 6,521,511, "Thin film device transfer method, thin film device, thin film integrated circuit device, active matrix board, liquid crystal display, and electronic apparatus".

However, the most difficult aspect of the substrate transfer method is the selection of the releasable adhesion layer. Currently to the best of our knowledge, there is no suitable releasable adhesion layer, one that can provide good adhesion during high temperature fabrication processing and at the same time can delaminate at a low temperature for transferring to a target substrate.

SUMMARY OF THE INVENTION

This invention provides a lamination-transfer, or lamination-delamination, process employing a releasable adhesion layer having good adhesion and excellent mechanical stability during high temperature fabrication processes of thin film devices in the absence of light, and delaminating at a lower temperature in the presence of light for transferring to a target substrate.

One embodiment of this invention is a film of polymer whose thermal decomposition temperature changes drastically upon photoexposure. Examples of such materials are phthalaldehyde, polycarbonates and polyformals. However, the subject of this invention is a polymer whose thermal decomposition temperature changes drastically upon photoexposure and not limited to just these polymers. These polymers preferably have an additive of light activated acid catalyst to further reduce the decomposition temperature.

These polymers, prior to photoexposure, can withstand temperatures in the range of approximately 200° C. to 300° C. without decomposition, yet decompose at around 100° C. with photoexposure. The polymer decomposes cleanly into highly volatile, gaseous products, leaving both the device composite and the substrate available for the next process steps.

The light source can be visible light, ultraviolet light, or x-ray, with low intensity. The delamination can be localized by selectively exposing a portion of the releasable adhesion layer to light. The transfer layer or the donor substrate is preferably transparent with respect to the light source to allow the light to reach the releasable adhesion layer.

These photo enhanced decomposition polymers can be used as a releasable adhesion layer in a thermal transfer element comprising a donor substrate and a multicomponent transfer layer. The multicomponent transfer layer can be processed in the absence of light, and therefore can sustain high temperature. Upon completion of the fabrication process, the multicomponent transfer layer is transferred to a receptor suitable for product characteristics using low temperature with photoexposure.

The multicomponent transfer layer can include a plurality of multicomponent transfer units. The multicomponent transfer unit can comprise a complete device, a complete circuit, or only a processed layer.

The multicomponent transfer unit can be released or transferred to a receptor substrate selectively by applying photoexposure selectively together with the heating step. The photoexposing and the heating steps can occur simultaneously, or the heating following the photoexposing step.

The present invention also discloses a device disposed on a receptor substrate, in which the device is formed by transferring a multicomponent transfer unit from a thermal transfer element to the receptor substrate. The device on the multicomponent transfer unit of the newly formed thermal transfer element can be transferred again to a new receptor.

DETAILED DESCRIPTION OF THE INVENTION

The present invention lamination-transfer, or lamination-delamination, or simply transfer process offers a solution to the mismatching substrate problem between the requirements of a substrate for fabrication processes and the characteristics desirable for a product substrate.

The disclosed transfer process involves the following steps: Semiconducting or other thin film devices with fine patterns are fabricated on a substrate with the desired optimal properties for fabrication that has been first coated with a suitable releasable adhesion layer. Subsequently, a second substrate with the desired properties for the target use of the fabricated semiconductor device is laminated onto the top of the devices. A trigger process is used to separate the devices from the fabrication substrate resulting in the semiconductor devices being attached to the second substrate. This process may be used with either finished devices (typically multilayer in construction), or with individual layers which are successively transferred to fabricate a finished device. In the descriptions of the invention, the words "device" and "device layer" will refer to both possibilities.

If the target substrate is coated with the suitable releasable adhesion layer, the process can be repeated to a new target substrate. The second transfer can be useful to preserve the up/down position of the thin film device.

Lamination and delamination are common techniques. Many materials with specifically tailored adhesives and release properties are known to those skilled in the art in this industry. However, lamination and delamination are often two distinct properties, and very often not complementary. The chemistry of the adhesive must be carefully engineered for each application. As a result, the resulting surface could stick to a target surface tightly (in the case of a typical tape), moderately (for example masking tape) or weakly (to a carrier substrate, such as for stickers, stamps, labels, etc.).

However, while surfaces can be designed for either strong adhesion or easy release, it is difficult to switch from one to the other. Thus, for example, there is not available a mechanism to provide strong adhesion of two surfaces for a limited time, and then switch the properties to weak or no adhesion to allow delamination.

The present application discloses a releasable adhesion layer which provides good adhesion and excellent mechanical stability during the fabrication of devices such as roll-to-roll processing at the required process temperatures, but which will delaminate cleanly at the desired time so that the expensive fabrication substrate may be reused. Preferably this transfer should be susceptible to patternwise use, so that specific portions of a film or device can be selected and transferred according to need. The present invention offers significant improvement over ordinary lamination materials commonly used in web products.

One embodiment of this invention is a film of polymer whose thermal decomposition temperature changes drastically upon photoexposure. Examples of such materials are phthalaldehyde, polycarbonates and polyformals. However, the subject of this invention is a polymer whose thermal decomposition temperature changes drastically upon photoexposure and not limited to just these polymers.

The polycarbonate preferably comprises a plurality of a tertiary carbon next to one carbonate carbonyl per monomer unit to stabilize carbonium ion formation. The polyformal preferably comprises a bisallylic diol or a bisbenzylic diol with a dihalomethane (source of -CH2-unit) per monomer unit. Polymers such as phthalaldehyde have a large decomposition temperature difference directly upon exposure to light. Adding light activated acid or base catalyst would reduce the decomposition temperature with photoexposure. Thus polymers such as polycarbonates and polyformals preferably have an additive of light activated acid catalyst. Upon light exposure, the light activated acid catalyst releases hydrogen ions which cleave the polymers to significantly reduce the decomposition temperature. The common light activated acid catalysts are such compounds as onium salts, for example diphenyliodonium or triphenylsulfonium salts of non-nucleophilic anions such as hexafluorophosphonium, trifluorosulfonate, and others. These are described for example by T. Ueno, in "*Microlithography: Science and Technology*", J. R. Sheats and B. W. Smith, editors (Marcel Dekker, Inc., 1998), p. 451–476, hereby incorporated by reference. There are other acid and base catalysts, including organohalogen compounds such as trichloromethyl-s-triazine, o- and p-nitrobenzyl esters, alkylsulfonates, α-hydroxymethylbenzoin sulfonic acid esters, α-sulfonyloxyketones, diazonaphthoquinone sulfonates, α, α'-bisarylsulfonyl diazomethanes, and disulfones, and other thermally decomposable polymers including polysilylethers and O,O— and N,O— acetals.

These polymers, prior to photoexposure, can withstand temperatures in the range of approximately 200° C. to 300° C. without decomposition, yet decompose at around 100° C. with photoexposure. The effective photoexposure can be a wide spectrum of wavelengths, or a narrow spectrum of wavelength or only a particular wavelength to prevent accidental release. The polymer can be designed to decompose at lower temperature such as room temperature with photoexposure, however, a reasonable temperature such as 100° C. is assurance that the decomposition will not be accidentally released. The combination of light and temperature is the safeguard against such accidental release. The polymer decomposes cleanly into highly volatile, gaseous products, leaving both the device composite and the substrate available for the next process steps.

Phthalaldehyde decomposes in the presence of heat and light as follows:

A typical polycarbonate can decompose in the presence of light and heat as follows:

The key element of the polycarbonates is a tertiary carbon next to one carbonate carbonyl to stabilize carbonium ion formation. Therefore instead of the —C(CH$_3$)—C(CH$_3$)— as in the above example, one can use a R' substitution, and the general polycarbonate will be:

The R' substitution can be or

Polycarbonates with one CO$_3$ per monomer unit also work, for example:

This polymer decomposes into CO$_2$ and H$_2$O, plus a combination of the following compounds In general, polycarbonates with one CO$_3$ per monomer unit can be written:

There is also a variety of substitutions on the organic sub-units for these polymers.

The polyformals can be bisallylic diol:

with a general formula having a substitution R on the organic sub-unit —CH$_2$—

The polyformals can be bisbenzylic diol:

with a general formula having a substitution R on the organic sub-unit —$CH_2$—

The polymers presented above are just examples of a class of polymers whose decomposition temperature changes significantly with photoexposure. It is to be understood that both these general and detailed descriptions are exemplary, and are not restrictive of the invention.

The light source for the photoexposure can be visible light, ultraviolet light, or x-ray, with the intensity of less than 1 W/cm$^2$. Infrared light can be used, however its photoexposure effect is not as good as the shorter wavelength lights since infrared light tends to easily convert to thermal energy. The delamination can be localized by selectively exposing a portion of the releasable adhesion layer to light. The transfer layer or the donor substrate is preferably transparent with respect to the light source to allow the light to reach the releasable adhesion layer. The term transparent means good light transmission, and therefore a thin metal substrate such as aluminum is transparent if an x-ray light is used. Laser light can also be used, but other light sources are preferable due to their cost effectiveness.

This invention does not require an intense light or heat source. The light intensity can be very low (less than 100 milliwatts per cm$^2$ for typical photosensitizer concentrations as used in microlithography formulations), and so common non-laser light sources can be used to give high throughput at low cost. The subsequent heating can be obtained from common large-area sources such as are commonly used in drying tunnels, for example, in web coating. Alternatively, for enhanced process control a confined infrared or thermal line source, which emits in a line that is narrow along the web direction but stretches across it in the transverse direction, may be used. Suitable down-web dimensions are of the order of 1–10 millimeters, and so may be readily obtained from conventional (non-laser) sources which are advantageous in cost and have high energy efficiencies.

In addition to photodecomposition initiated by visible or ultraviolet light, x-rays may be used along with x-ray sensitizers for generating catalytic acids or bases for use with the thermally decomposable polymers. Since for most applications no collimation or fine resolution of the x-ray beam is needed, the source can be inexpensive and efficient. This allows substrates to be used which are completely opaque to ultraviolet or visible light.

When high spot placement accuracy is required, a laser can be particularly useful as the light source.

While polymers are typically used in web processing for their handling properties and low cost, metal foils can also be used as substrates. In this case process temperature constraints are minimized, and although the coefficient of thermal expansion of metals in usually larger by several fold than that of silicon, the mismatch is no worse that between silicon and the interconnect metalization. If a metal substrate is used, the present invention is also applicable. Light-induced release is not possible by backside radiation, but x-rays may be used if the foil is thin or is comprised of a low atomic weight element such as aluminum. Visible or ultraviolet light may still be applied from the front side if the devices are partially transparent, which is often the case. For example, polysilicon TFTs, indium tin oxide (ITO) electrodes, and polymer transistors transmit substantial amounts of light; even amorphous silicon TFTs are not completely opaque.

The fact that the substrate surface is easily restored to a pristine state, and the material is mechanically highly durable, so that it can be reused almost indefinitely, is an advantage of using metal.

The present invention releasable adhesion layer using these polymers also provides a high degree of chemical cleanliness. The releasable adhesion layer does not remain in place, and therefore will not contaminate the transferred device. The present materials are known to decompose completely, with no detectable residue. Hence sensitive organic layers, such as might be found, for example, in organic light emitting diodes or organic transistors, will experience negligible contamination if transferred by this technique. A vacuum orifice can be advantageously placed close to the line of delamination, to collect the gaseous products and prevent them from condensing on surfaces where they are not wanted.

Figure 1:
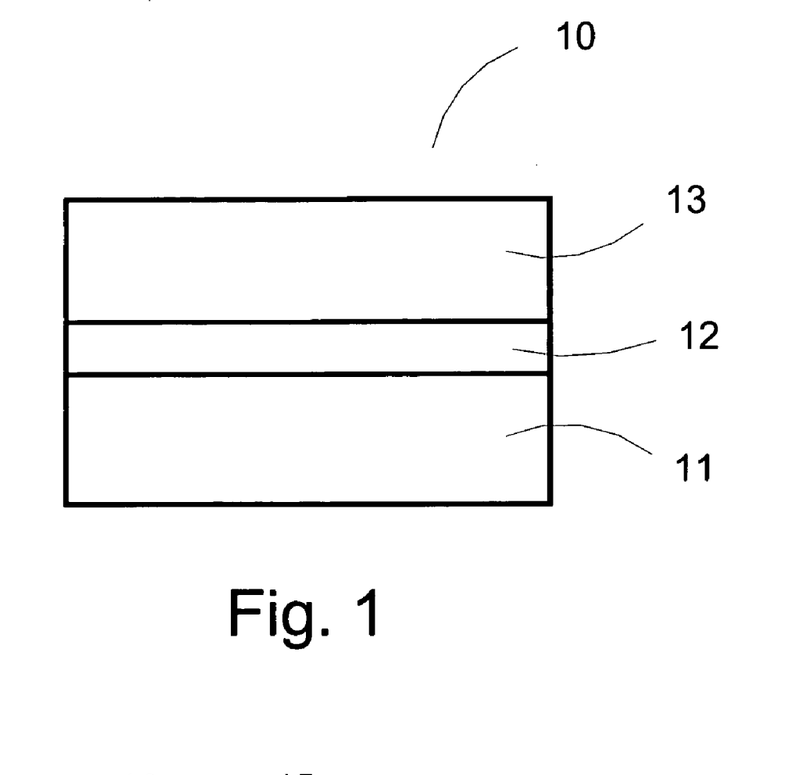
FIG. 1 shows an embodiment of the thermal transfer element according to the present invention.

Another embodiment of the present invention is a thermal transfer element utilizing these polymers as the releasable adhesion material. FIG. 1 shows a thermal transfer element 10 comprising a donor substrate 11 and a multicomponent transfer layer 13 with the releasable adhesion layer 12 between the donor substrate 11 and the multicomponent transfer layer 13. The multicomponent transfer layer can be processed in the absence of light, and therefore can sustain high temperature. Upto completion of the fabrication process, the multicomponent transfer layer can be transferred to a receptor suitable for product characteristics. The transfer process can be performed at low temperature with photoexposure.

The donor substrate in the disclosed thermal transfer element can be a polymer substrate, a paper substrate, a glass substrate, a semiconductor substrate, or a metal substrate. Other films with sufficient optical properties (if light is used for heating and transfer), including high transmission of light at a particular wavelength, as well as sufficient mechanical and thermal stability for the particular application, can be used. The donor substrate main characteristic is to satisfy all the requirements necessary for the fabrication of the multicomponent transfer layer. The multicomponent transfer layer can comprise a memory device, a semiconductor device such as field effect transistor, bipolar transistor, metal-oxide-semiconductor field effect transistor, a thin film transistor, a display device such as LED, OLED, flat panel display, an electronic device or an electronic or optical component such as resistor, capacitor, inductive coil, or waveguide.

The substrate such as a degassed polyimide is coated with a thin film, typically about 1 micron thick, of the release polymer, which may or may not be followed by a matching layer that is optimized for the deposition of subsequent device films. While the release layer is optimally about 1 micron thick in most cases, it may be much thinner or thicker, in the range of 0.1 micron or less to at least 10 microns. Factors which govern the choice of thickness include the amount of force that one wishes to develop when the release layer is decomposed, the roughness of the substrate, the speed of coating required, and the optical density of the film if photoexposure is required to effect decomposition.

A variety of coating techniques known in the art can be used; for example, roll coating, slot die coating, gravure coating, and so on. The coating technique can be selected to optimize the coating quality for a particular polymer and substrate combination. While the invention has been conceived with respect to the needs of web processing, it may also be used with rigid substrates, in which case spin coating is a viable coating technique for the release layer.

The matching layer can be either thicker or thinner than the release layer. It could be, for example, a castable polyimide which is cured to provide a heat and chemical resistant covering for the devices. It could also be an inorganic layer. After the final substrate lamination, this layer will form the encapsulation layer for the devices. In some cases this layer will not be used; for example if additional layers are to be deposited on the devices after the transfer, then no protective layer would be wanted.

Figure 2A:
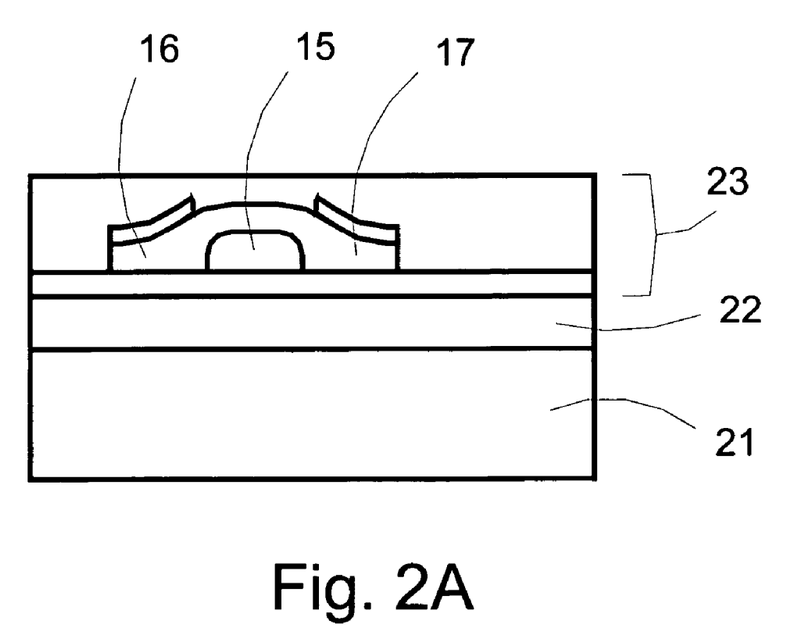
FIGS. 2a and 2b show other embodiments of the present invention thermal transfer element.
Figure 2B:
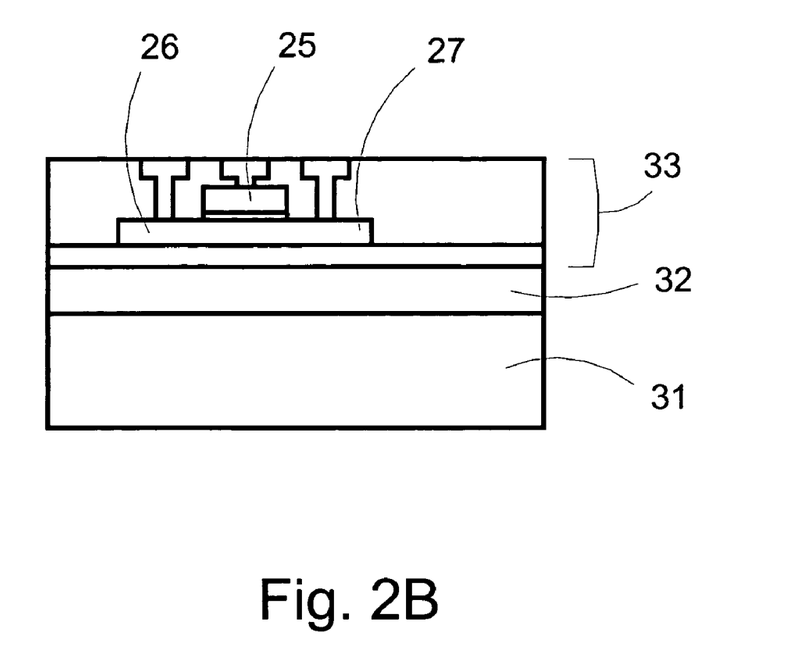

FIG. 2a shows a thermal transfer element with the multicomponent transfer layer 23 comprising a thin film transistor having a gate 15, a source 16 and a drain 17, disposed on a releasable adhesion layer 22 on a donor substrate 21. And FIG. 2b shows a thermal transfer element with the multicomponent transfer layer 33 comprising a field effect transistor having a gate 25, a source 26 and a drain 27, disposed on a releasable adhesion layer 32 on a donor substrate 31.

In another embodiment of the invention, the multicomponent transfer layer includes a plurality of multicomponent transfer units to be transferred. The multicomponent transfer units can be selectively released by exposing only these multicomponent transfer units to light. The heating can be applied to the whole transfer layer, or only these selected multicomponent transfer units. The light and heat is needed at the adhesion layer to decompose the adhesion layer film, but the exposure of light and heat is preferably applied through the transfer layer or the donor substrate and transferred to the adhesion layer.

Figure 3:
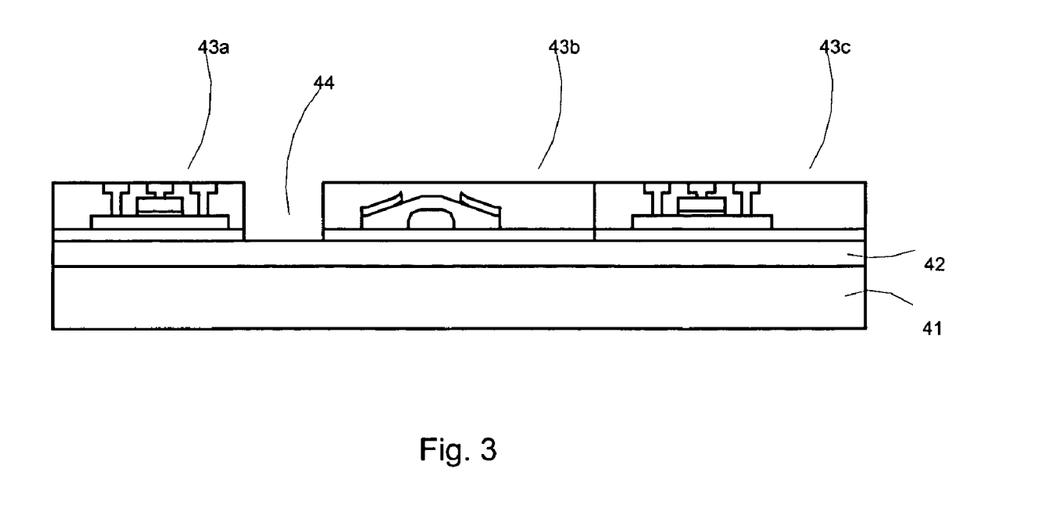
FIG. 3 shows another embodiment of the present invention thermal transfer element.

FIG. 3 shows a thermal transfer element having three multicomponent transfer units 43a, 43b and 43c, disposed on a releasable adhesion layer 42 on a donor substrate 41. The multicomponent transfer units 43a and 43b are separated by an air gap 44 to facilitate the selective release of one multicomponent transfer unit without disturbing the other. The air gap 44 is optional and can be omitted if the selective release of one or more multicomponent transfer units will not affect the neighbor multicomponent transfer units as in the case of multicomponent transfer units 43b and 43c.

Figure 4A:
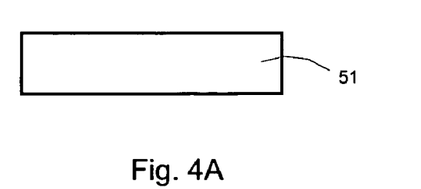
FIGS. 4a–4g show an embodiment of the preparation of a thermal transfer element.
Figure 4B:
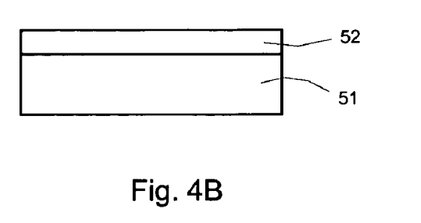
Figure 4C:
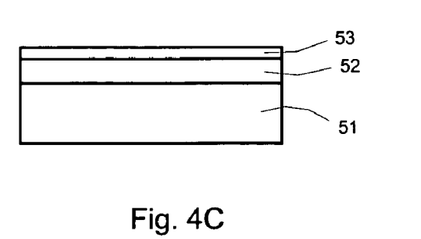
Figure 4D:
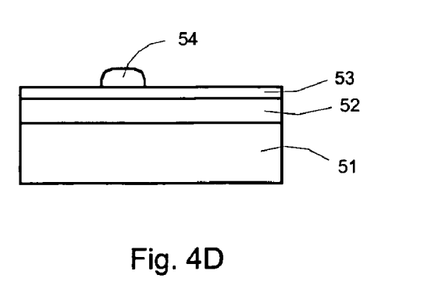
Figure 4E:
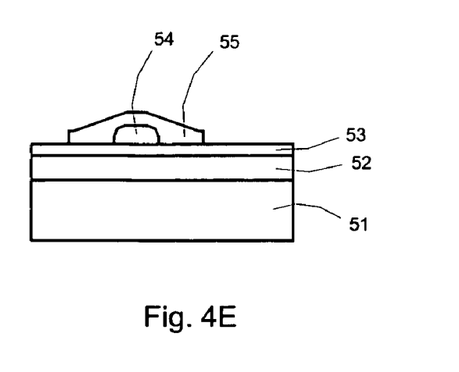
Figure 4F:
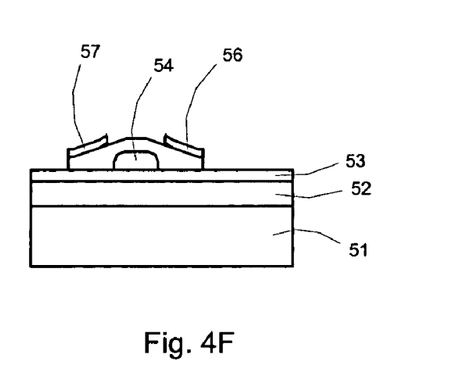
Figure 4G:
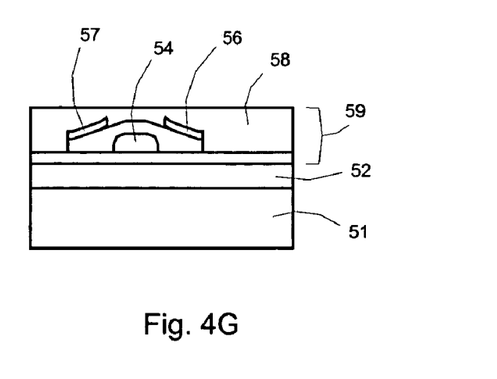

FIGS. 4a–4g show an embodiment of the preparation of a thermal transfer element having a thin film transistor. The thermal transfer element is preferably fabricated by preparing a donor substrate 51 as shown in FIG. 4a. Then the releasable adhesion layer 52 is coated on the donor substrate (FIG. 4b). A protective layer 53 is further coated on the releasable adhesion layer 52 (FIG. 4c). The protective layer 53 serves as a base for the thin film transistor to be processed, or a protective coating after transfer. Then the thin film transistor is fabricated on the protective layer 53. A gate 54 is first patterned on the protective layer 53 (FIG. 4d), followed by a silicon layer 55, serving as the transistor channel (FIG. 4e). Source and drain implantation is then fabricated together with the source and drain interconnects 57 and 58 (FIG. 4f). The thin film transistor is then coated with a passivation layer 58. The thin film transistor structure forms the multicomponent transfer unit 59. With the photo/heat exposure, the releasable adhesion layer 52 can be decomposed to release the multicomponent transfer unit 59 to a receptor.

Another embodiment of the present invention is the method of transfer. The multicomponent transfer layer or the multicomponent transfer units can be transferred from a thermal transfer element. The transfer method comprises the step of photoexposing and heating the releasable adhesion layer to delaminate the adhesion layer, therefore releasing the multicomponent transfer layer or the multicomponent transfer units. The photoexposing and the heating steps can occur simultaneously, or the heating following the photoexposure step, or vice versa. The thermal transfer element can be heated by directing heat to the thermal transfer element. Heat can be generated using a heating element (e.g., a resistive heating element), converting infrared radiation to heat, and/or applying an electrical current to a layer of the thermal transfer element to generate heat. In addition, light from, for example, a lamp or laser, can be applied selectively on a portion of the thermal transfer element. Light activated delamination is advantageous because of the accuracy, precision and flexibility that can often be achieved. The size and shape of the transferred pattern can be controlled by, for example, selecting the size of the light beam, the exposure mask, the exposure pattern of the light beam, the duration of directed beam contact with the thermal transfer element, and the materials of the thermal transfer element.

The multicomponent transfer units can be released and collected before transferring to a receptor substrate. The multicomponent transfer units can also be transferred directly to a receptor substrate by contacting the transfer units with the receptor receiving surface before releasing the adhesion layer. During transferring, the thermal transfer element is typically brought into intimate contact with the receptor. A compressive force or pressure may be used to improve the contact between the multicomponent transfer layer and the receptor substrate. In some instances, vacuum can be used to hold the thermal transfer element in intimate contact with the receptor. The transfer layer or the receptor can include an adhesive layer disposed on an outer surface to facilitate adhesion.

The receptor substrate may be any substrate suitable for a particular application including, but not limited to, transparent films, display substrate, electronic displays, metals, semiconductors, glass, various papers, polymer substrate, and plastics.

The receptor substrate can already comprise other devices. The existing devices on the receptor substrate can form electrical connection with the device on the multicomponent transfer unit. For further transferring, the new device on the receptor substrate can be transferred again, with or without further processing, to another receptor, and with or without forming electrical connections with the new receptor.

Figure 5A:
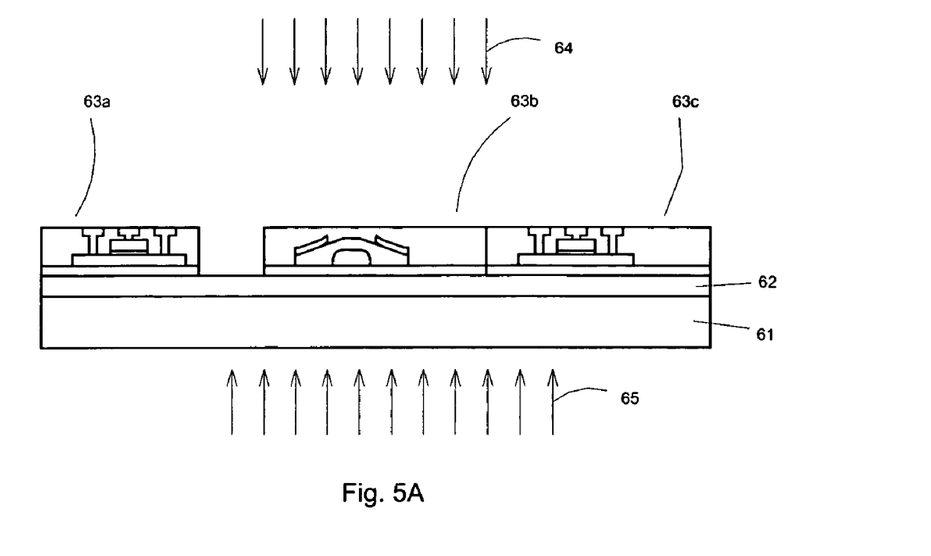
FIGS. 5a–5c show an embodiment of the method of transfer of a multicomponent transfer unit from a thermal transfer element.
Figure 5B:
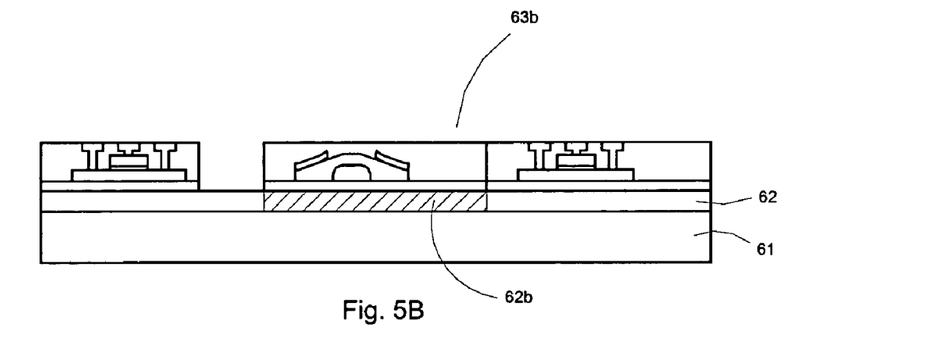
Figure 5C:
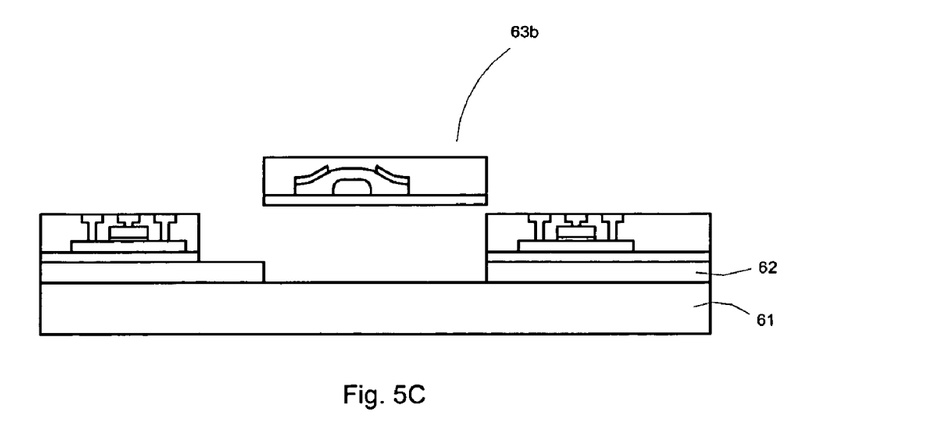

FIGS. 5a–5c show an embodiment of the release of a multicomponent transfer unit from the thermal transfer element. A plurality of multicomponent transfer units 63a, 63b and 63c are disposed on a releasable adhesion layer 62 on a donor substrate 61 (FIG. 5a). A heat source 65 and a light source 64 are applied to the releasable adhesion layer 62. The light source 64 can be applied selectively on the multicomponent transfer unit 63b, preferably through a mask while the heat source 65 can be applied to the whole thermal transfer element. The light source 64 is chosen to be focused onto the selective transfer unit 63b while the heat source 65 is chosen to be applied non discriminatorily on the whole transfer element because it is much easier to focus the light source than to focus or restrict the heat source. Within the scope of the invention, either the heat source or the light source or both can be focused to selectively release the desired multicomponent transfer units. The intensity and magnitude of the light and heat source are chosen to decompose the adhesion layer without damaging the transfer units. Then the portion 62b of the releasable adhesion layer receiving both light and heat will be decomposed (FIG. 5b) and the transfer unit 63b will be released from the thermal transfer element (FIG. 5c).

Figure 6A:
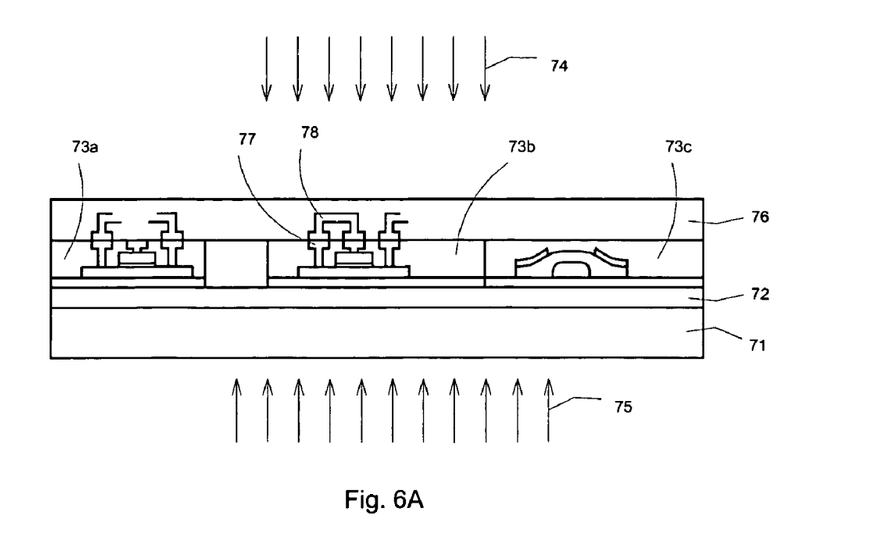
FIGS. 6a–6c show another embodiment of the method of transfer of a multicomponent transfer unit from a thermal transfer element to a receptor.
Figure 6B:
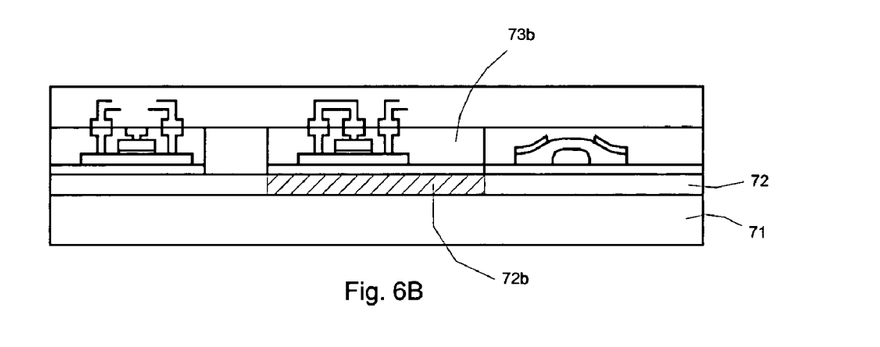
Figure 6C:
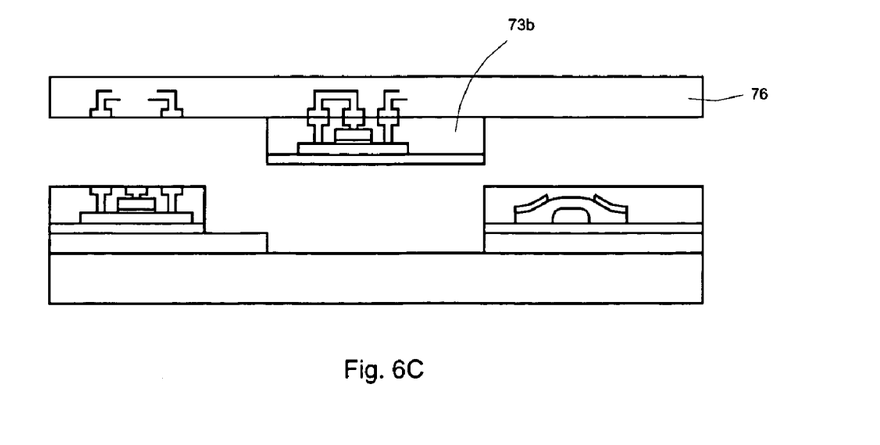

FIGS. 6a–c show an embodiment of the transfer of a multicomponent transfer unit from the thermal transfer element to a receptor. A plurality of multicomponent transfer units 73a, 73b and 73c are disposed on a releasable adhesion layer 72 on a donor substrate 71 (FIG. 6a). A heat source 75 and a light source 74 are applied to the releasable adhesion layer 72 together with the contact of the receptor 76 receiving surface. Then the portion 72b of the releasable adhesion layer receiving both light and heat will be decomposed (FIG. 6b) and the transfer unit 73b will be released from the thermal transfer element and transferred to the receptor 76 (FIG. 6c). These figures also show that the transfer unit 73b is forming electrical contact with the receptor substrate through the transfer unit contact pad 77 and the receptor contact pad 78. The electrical contact between the transfer unit and the receptor substrate may or may not be needed depending on a particular application.

Figure 7A:
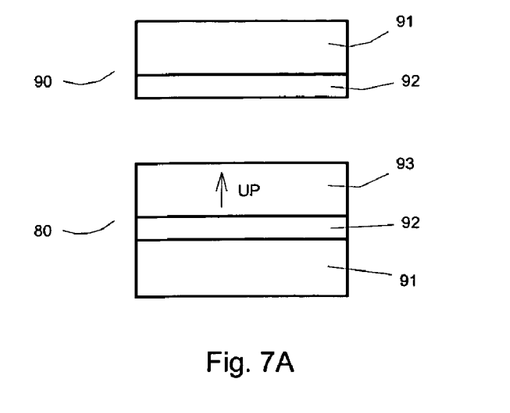
FIGS. 7a–7g show the transfer sequence of 2 consecutive transfers according to the present invention.
Figure 7B:
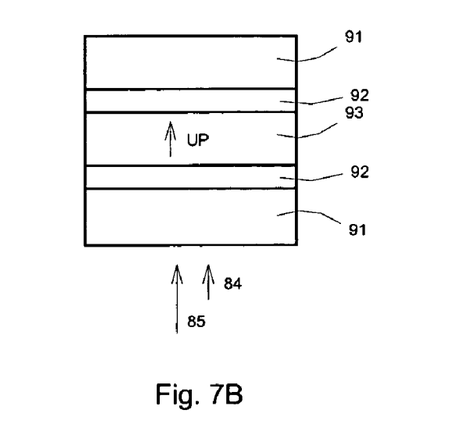
Figure 7C:
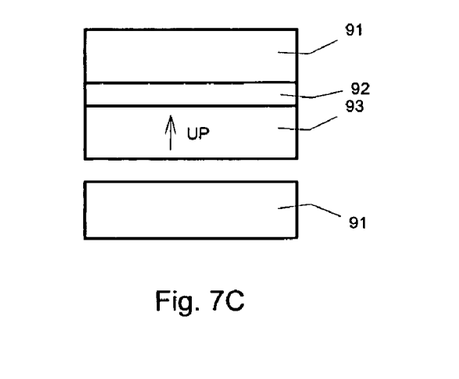
Figure 7D:
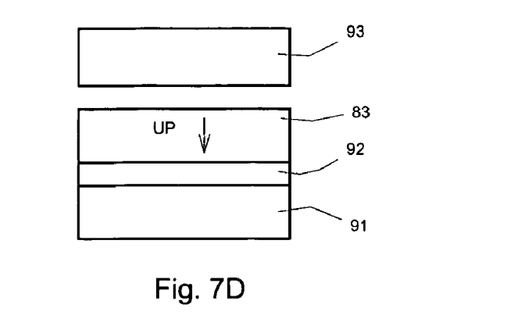
Figure 7E:
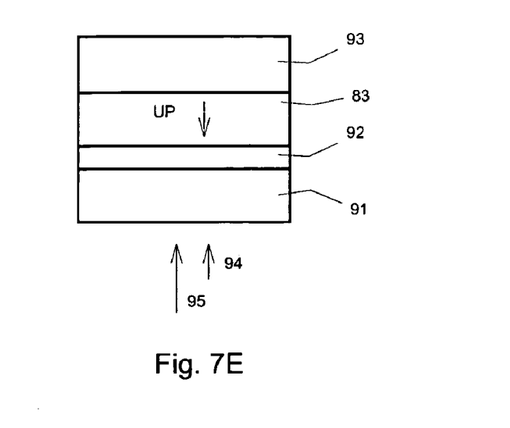
Figure 7F:
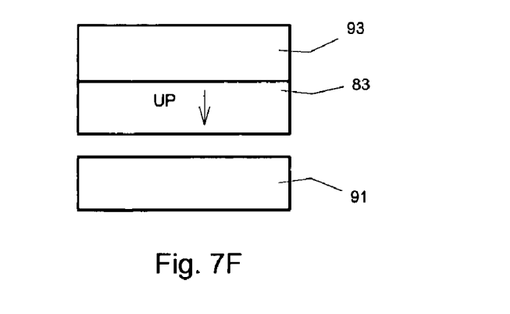
Figure 7G:
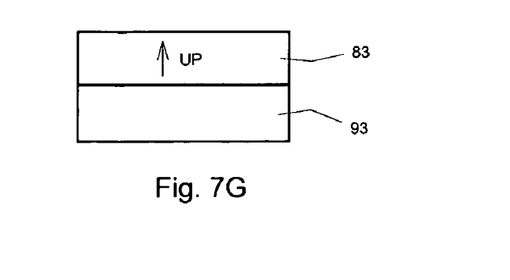

The receptor can have a releasable adhesion layer coated on the receiving surface so that together with the transferred multicomponent transfer unit, it forms a new thermal transfer element. The device on the multicomponent transfer unit of the newly formed thermal transfer element can be transferred again to a new receptor. FIGS. 7a–7g show the transfer sequence of 2 consecutive transfers. Starting with a thermal element 80 comprising a transfer unit 83 on a releasable adhesion layer 82 on a substrate 81, and a receptor 90 comprising another releasable adhesion layer 92 on a receptor substrate 91 (FIG. 7a). The thermal element 80 and the receptor 90 are brought into contact and the structure is subjected to a heat 84 and light 85 sources (FIG. 7b). Care should be taken so that the heat and light source 84 and 85 only reach the adhesion layer 82 and not the adhesion layer 92 such as by coating a reflective layer on top of the transfer unit 83 or adhesion layer 92 (not shown). Under the light and heat exposure, the adhesion layer 82 is decomposed, leaving the transfer unit 83 transferred to the receptor 91/92 to form a new thermal transfer element (FIG. 7c). The new thermal transfer element is approached by a new receptor 93 (FIG. 7d). Notice the reversal in orientation of the transfer unit 83. The new structure is again subjected to heat 94 and light 95 sources (FIG. 7e). The adhesion layer 92 is decomposed (FIG. 7f), leaving the new receptor with the transfer unit 83 in the right orientation (FIG. 7g).

In some instances, it may be necessary, desirable, or convenient to sequentially transfer two or more different thermal transfer elements. For example, one thermal transfer element may be used to form a first device, and another thermal transfer element may be used to form a second device on the same receptor substrate.

A wide variety of devices or layers that can be used to form the device, may be transferred by this method, for example (but not limited to): amorphous silicon thin film transistors, polycrystalline thin film transistors, organic transistors, field effect transistors, bipolar transistors, unijunction transistors, MOS transistors, metal-insulator-semiconductor transistors, organic or inorganic light emitting devices, passive electronic elements such as resistors, capacitors and inductors, printed wiring, optical or optoelectronic devices such as waveguides, splitters, lenses, gratings, holographic elements, filters, mirrors, couplers, combiners, modulators, optical cavities, multiplexers and amplifiers, chemical or biochemical sensors, electronic circuitry, diodes, rectifiers, electroluminescent lamps, memory elements, charge coupled devices, integrated circuits, photodetectors, lasers, piezoelectric devices, ferroelectric devices, or thin film batteries.

In addition, either completed devices or individual layers of such devices may be transferred. Thus the technique is useful both for transfer of complete devices from one substrate to another, or for transfer of individual layers of devices in the fabrication process of such devices. An OEL (organic electroluminescent) or an OLED (organic light emitting diode) device can be formed by transferring thin layers of suitable organic materials sandwiched between a cathode and an anode.

In another embodiment, the present invention discloses a device disposed on a receptor substrate. The device is formed by transferring a multicomponent transfer unit from a thermal transfer element to a receptor substrate. The device is included in the multicomponent transfer unit, and can form electrical contact with other existing devices on the receptor.

Another embodiment of the present invention is the disclosure of a circuit or a display comprising a plurality of thin film transistor devices or components disposed on a receptor substrate. At least one of the thin film transistor devices or components is formed by transferring a multicomponent transfer unit from a thermal transfer element to the receptor substrate. The circuit or the display can comprises a memory device, a portion of a memory device, a logic device or a portion of a logic device. The receptor substrate can comprise a memory device, a portion of a memory device, a logic device or a portion of a logic device. The circuit or the display and the receptor each can comprise a portion of a memory device, and together form a complete memory device. The circuit or the display comprises a plurality of first electrodes of a cross bar memory device and the receptor comprises a plurality of second electrodes of a cross bar memory device, and together form a complete cross bar memory device. The circuit or the display and the receptor each comprises a portion of a logic device, and together form a complete logic device.

Figure 8:
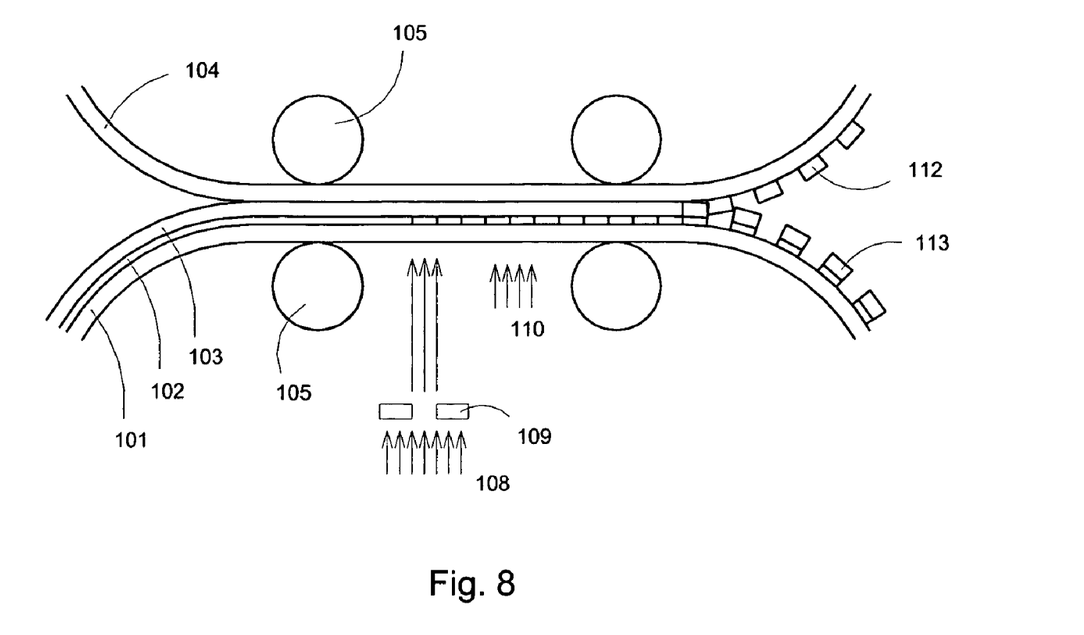
FIG. 8 shows an overall view of the transfer process in the context of web-based, or roll-to-roll transfer.

FIG. 8 shows an overall view of the transfer process of in the context of web-based, or roll-to-roll transfer. The releasable adhesion layer 102 is deposited on the donor substrate 101. The transfer layer 103 is subsequently deposited and processed on the releasable adhesion layer 102. The donor substrate/releasable adhesion layer/transfer layer composite is brought into contact with the receptor substrate 104 and exposed to a compressive force exerted by a pair of rolls 105 to form a multilayer. The multilayer is subjected to an impinging light 108 through a pattern 109 (in this embodiment, a mask). Subsequently, the multilayer is exposed to a heat source 110 which causes the releasable adhesion layer 102 to decompose to a gas. The expansion of the gas forces the receptor substrate 104 away from the donor substrate 101 while exerting a compressive force on the transferred unit 112 and receptor substrate 104, enhancing the adhesion between the transferred unit 112 and the receptor substrate 104. The transferred unit 112 adheres to the receptor substrate 104 and separates from the remaining transfer layer 113 on the donor substrate 101.

Figure 9:
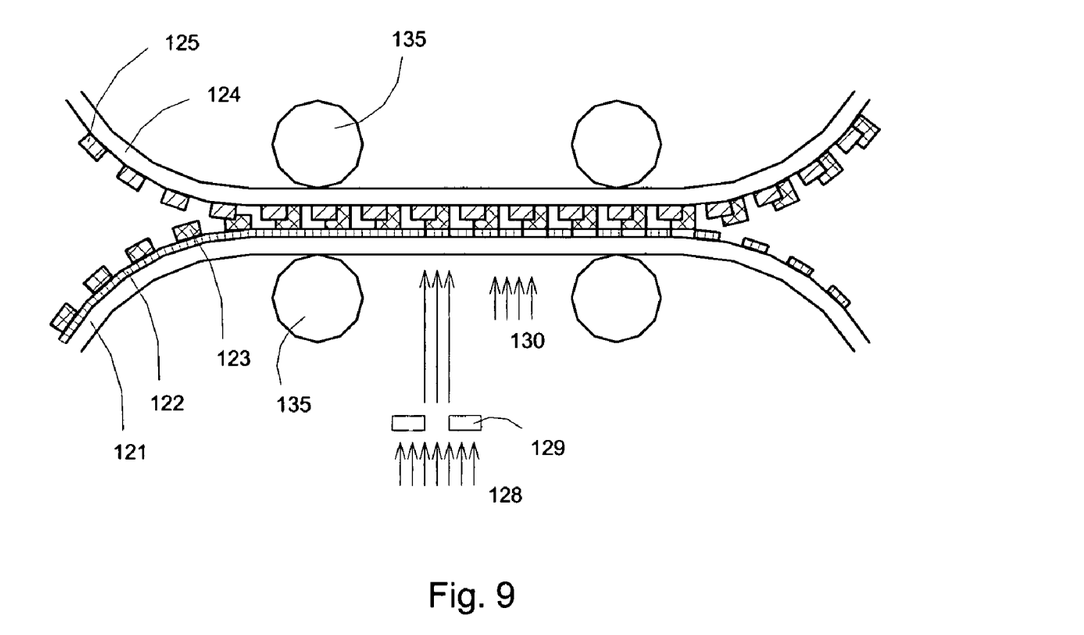
FIG. 9 shows another embodiment of the transfer process.

FIG. 9 shows another embodiment of the present invention where a receptor substrate 124 already has some existing devices 125. The existing devices 125 on the receptor substrate 124 can be formed by conventional fabrication techniques such as deposition and etching, or can be formed by a transfer method as shown in FIG. 8. FIG. 9 also shows a thermal transfer element comprises a plurality of transfer units 123 adhering to a donor substrate 121 through a releasable adhesion layer 122. The substrates 121 and 124 and the transfer unit 123 and the existing devices 125 are brought into contact and exposed to a compressive force exerted by a pair of rolls 135 to form a multilayer. The multilayer is subjected to an impinging light 128 through a pattern 129. Subsequently, the multilayer is exposed to a heat source 130 which causes the releasable adhesion layer 122 to decompose to a gas. The expansion of the gas forces the receptor substrate 124 away from the donor substrate 121 while exerting a compressive force on the transferred unit 123, the existing devices 125 and receptor substrate 124, enhancing the adhesion between the transferred unit 123, the existing devices 125 and the receptor substrate 124. The transferred unit 112 adheres to the existing devices 125 and the receptor substrate 104 and separates from the donor substrate 121.

Figure 10A:
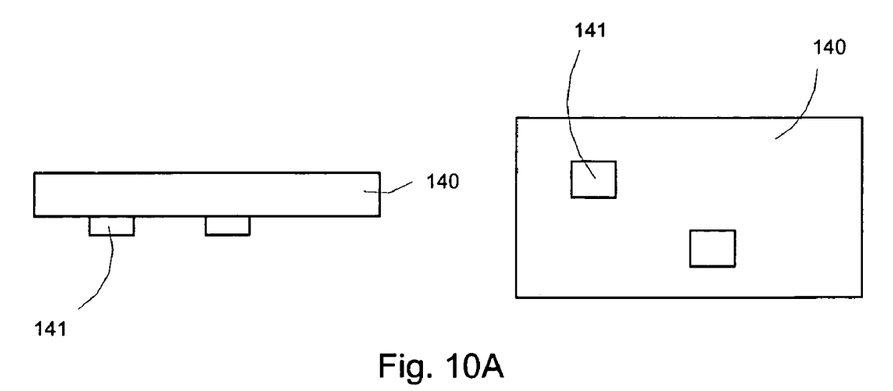
FIGS. 10a–10c show a sequence of the pattern transfer process.
Figure 10B:
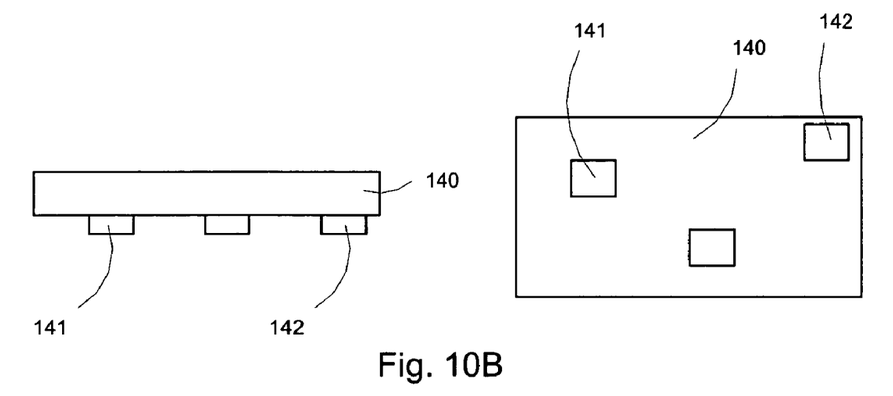
Figure 10C:
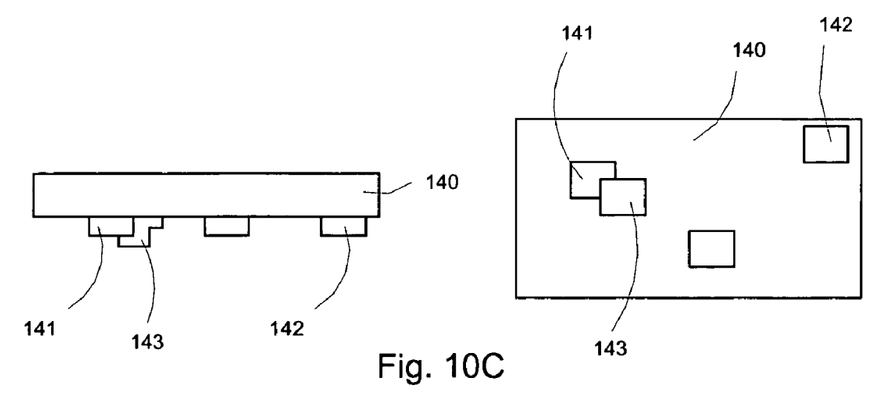

FIGS. 10*a*–10*c* show a sequence of the pattern transfer process. Existing devices 141 are fabricated on a receptor substrate 140, either by lamination/delamination transfer method as disclosed in the present invention, or by a conventional fabrication process (FIG. 10*a*). A plurality of devices 142 is transferred to the receptor substrate 140 (FIG. 10*b*). Then another plurality of devices 143 is transferred to the same receptor substrate 140 (FIG. 10*c*). In the second transfer, the devices 143 overlap the existing devices 142 or 141. Thus the device transfer may result in separately distinguishable patterns or in overlays.

The invention is preferably applicable in web-based, or roll-to-roll, coating, since it is expected to have a high degree of value in this context, but it will be apparent that it is equally applicable to the transfer of layers from one sheet of any substrate material to another, and that the roll-to-roll process is not in any way essential for the successful practice of the invention. It is applicable to the transfer of films from a rigid substrate to a flexible one, or vice versa. It may also be used to transfer films between rigid substrates, provided that they are flat enough to get sufficiently close approach of the surfaces.

What is claimed is:

1. A method to form a device disposing on a receptor substrate, the device being formed by transferring a multicomponent transfer unit from a thermal transfer element to the receptor substrate, wherein the multicomponent transfer unit comprises the device, and the thermal transfer element comprises a donor substrate and a transfer layer with a releasable adhesion layer disposed between the donor substrate and the transfer layer, the transfer layer comprising a plurality of multicomponent transfer units, and the releasable adhesion layer comprising a polymer composition having a low delamination temperature in the presence of light, whereby allowing the delamination of the adhesion layer to transfer the selected multicomponent units by exposing the selected multicomponent units to light; and maintaining good adhesion between the donor substrate and the transfer layer at a temperature higher than the delamination temperature in the absence of light, whereby permitting processing the multicomponent transfer units at a temperature higher than the delamination temperature, the method comprising imagewise exposing the releasable adhesion layer to light; and heating to decompose the releasable adhesion layer to transfer only the imagewise light-exposed areas to the receptor.

2. A method as in claim 1, wherein the device comprises a component in electronic circuitry, an electronic device, a thin film transistor device, a memory device, a portion of a memory device, a logic device, a portion of a logic device, or a display device.

3. A method as in claim 1, wherein the device is in electrical contact with other existing devices on the receptor.

4. A method as in claim 1, wherein the receptor receiving surface comprises a releasable adhesion layer to form a thermal transfer element.

5. A method as in claim 1, wherein the receptor substrate comprises a component in electronic circuitry, an electronic device, a thin film transistor device, a memory device, a portion of a memory device, a logic device, or a portion of a logic device.

6. A method as in claim 1, wherein the device and the receptor each comprises a portion of a memory or logic device, and together form a complete memory or logic device.

7. A method as in claim 1, wherein the device comprises a plurality of first electrodes of a cross bar memory device and the receptor comprises a plurality of second electrodes of a cross bar memory device, and together form a complete cross bar memory device.

8. A method as in claim 1, wherein exposing the releasable adhesion layer to light comprises illuminating the thermal transfer element with a light-emitting source according to a pattern covering the multicomponent transfer units.

9. A method as in claim 1, wherein exposing the releasable adhesion layer to light comprises illuminating the multicomponent transfer units with a light-emitting source.

10. A method as in claim 1, wherein exposing the releasable adhesion layer to light comprises illuminating the donor substrate with a light-emitting source.

11. A method as in claim 1, further comprising the step of contacting the receptor with the transfer layer of the thermal transfer element; before exposing the releasable adhesion layer to light.

12. A method as in claim 1, wherein the main ingredient of the polymer composition is selected from a group consisting of phthalaldehyde, polycarbonates and polyformals.

13. A method as in claim 12, wherein the polycarbonate comprises a plurality of a tertiary carbon next to one carbonate carbonyl per monomer unit.

14. A method as in claim 12, wherein the polyformal comprises a bisallylic diol or a bisbenzylic diol per monomer unit.

15. A method as in claim 1, wherein the polymer composition comprises an additive of a light-activated acid or base catalyst.

16. A method as in claim 1, wherein the light source is selected from a group consisting of visible light, ultraviolet light, and x-ray.

17. A method as in claim 1, further comprising an adhesive layer to facilitate adherence of the multicomponent transfer unit to the receptor.

18. A method as in claim 1, wherein the donor substrate is at least partially transparent with respect to the light source.

19. A method as in claim 1, wherein the multicomponent transfer unit is at least partially transparent with respect to the light source.

20. A method as in claim 1, wherein the receptor is a second thermal transfer element and the multicomponent transfer unit of the first thermal transfer element is in electrical contact with the multicomponent transfer unit of the second thermal transfer element.

21. A method as in claim 1, wherein the device is an organic electroluminescent device, an organic transistor, or an organic laser.

* * * * *